US009643838B1

(12) United States Patent
Chu et al.

(10) Patent No.: US 9,643,838 B1
(45) Date of Patent: May 9, 2017

(54) SEMICONDUCTOR DEVICE AND PACKAGE AND MANUFACTURING METHOD THEREOF

(71) Applicant: TAIWAN SEMICONDUCTOR MANUFACTURING COMPANY LTD., Hsinchu (TW)

(72) Inventors: Chia-Hua Chu, Hsinchu County (TW); Jung-Huei Peng, Hsinchu County (TW); Yi-Chien Wu, Taichung (TW); Li-Min Hung, Taoyuan County (TW)

(73) Assignee: TAIWAN SEMICONDUCTOR MANUFACTURING COMPANY LTD, Hsinchu (TW)

( * ) Notice: Subject to any disclaimer, the term of this patent is extended or adjusted under 35 U.S.C. 154(b) by 0 days.

(21) Appl. No.: 15/017,209

(22) Filed: Feb. 5, 2016

(51) Int. Cl.
| | |
|---|---|
| *H01L 23/02* | (2006.01) |
| *H01L 23/22* | (2006.01) |
| *H01L 21/00* | (2006.01) |
| *B81B 7/00* | (2006.01) |
| *B81C 1/00* | (2006.01) |

(52) U.S. Cl.
CPC ........ *B81B 7/0038* (2013.01); *B81C 1/00285* (2013.01); *B81B 2201/0235* (2013.01); *B81B 2201/0242* (2013.01); *B81B 2201/0271* (2013.01); *B81B 2203/0127* (2013.01); *B81B 2203/0315* (2013.01); *B81C 2203/0145* (2013.01)

(58) Field of Classification Search
CPC ..... B81B 7/0038; B81B 7/0041; B81B 7/008; B81B 2201/02; B81C 1/00277; B81C 1/00357; B81C 1/00293; B81C 1/00238; B81C 1/00285
USPC .......................... 257/678, 684–688, 723–725
See application file for complete search history.

(56) References Cited

U.S. PATENT DOCUMENTS

| | | | | |
|---|---|---|---|---|
| 2015/0329353 | A1* | 11/2015 | Cheng ................... | B81B 7/0041 257/415 |
| 2015/0360939 | A1* | 12/2015 | Zhang ................. | B81C 1/00246 438/51 |

\* cited by examiner

*Primary Examiner* — Hsien Ming Lee
(74) *Attorney, Agent, or Firm* — WPAT, P.C., Intellectual Property Attorneys; Anthony King

(57) ABSTRACT

A semiconductor device includes a substrate, an interconnection layer, an outgassing layer, and a patterned outgassing barrier layer. The interconnection layer is over the substrate. The outgassing layer is over the interconnection layer. The patterned outgassing barrier layer is over the outgassing layer. The patterned outgassing barrier layer includes a plurality of barrier structures and a plurality of openings. The plurality of openings expose a portion of an upmost surface of the outgassing layer, and a bottommost surface of the patterned outgassing barrier layer is substantially coplanar with the upmost surface of the outgassing layer.

20 Claims, 13 Drawing Sheets

SEMICONDUCTOR DEVICE AND PACKAGE AND MANUFACTURING METHOD THEREOF

BACKGROUND

Micro electromechanical systems (MEMS) devices are used for various applications including gyroscopes, resonators, accelerometers or other applications. For example, accelerometers are commonly found in automobiles (e.g., in airbag deployment systems), and gyroscopes are commonly found in global positioning system (GPS).

In recent years, it is increasingly common for MEMS device to be incorporated into integrated chips formed by a complementary metal-oxide-semiconductor (CMOS) process. The incorporation of MEMS into a CMOS process allows for widespread use of MEMS device fabricated with a high throughput.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
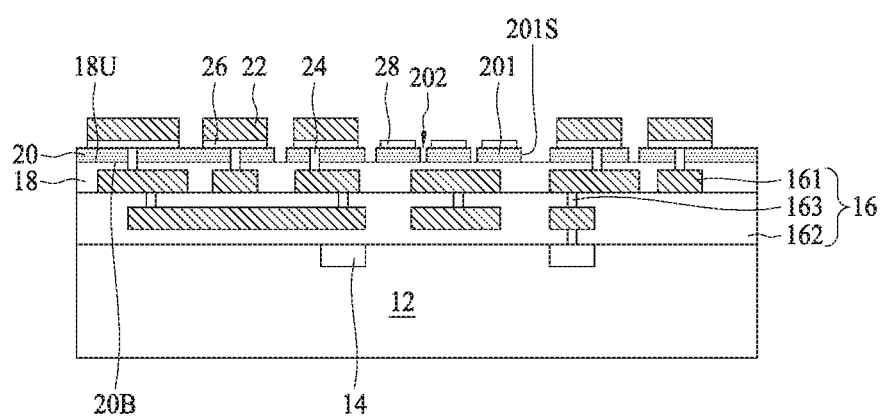
FIG. 1 is a schematic cross-sectional view of a device wafer in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first" and "second" describe various elements, components, regions, layers and/or sections, these elements, components, regions, layers and/or sections should not be limited by these terms. These terms may be only used to distinguish one element, component, region, layer or section from another. The terms such as "first" and "second" when used herein do not imply a sequence or order unless clearly indicated by the context.

As used herein, the term "substantially" refers to the complete or nearly complete extent or degree of an action, characteristic, property, state, structure, item, or result. For example, a surface that is "substantially" coplanar with another surface would mean that these two surfaces are either completely located in the same plane or nearly completely located in the same plane. The exact allowable degree of deviation from absolute completeness may in some cases depend on the specific context. However, generally speaking the nearness of completion will be so as to have the same overall result as if absolute and total completion were obtained.

As used herein, a MEMS wafer refers to a wafer or a substrate on which a MEMS device or at least a portion of a MEMS device is formed.

As used herein, a device wafer refers to a wafer or a substrate on which an active device such as a CMOS device or at least a portion of an active device is formed. In some embodiments, a portion of a MEMS device may be formed on the device wafer.

As used herein, a cap substrate refers to a thicker substrate used as a carrier for the thinner MEMS wafer. In some embodiments, the cap wafer is also configured as a protection cap, and/or configured to form hermetic cavity together with the MEMS wafer and the device wafer.

MEMS devices require different pressures in the hermetic cavities defined by the device wafer, the MEMS wafer and the cap substrate. For example, an accelerometer requires an enclosure with greater pressure while a gyroscope or a resonator requires an enclosure with lower pressure. In some embodiments, a pressure in the enclosures of a gyroscope or a resonator is less than or equal to 0.001 millibar (mbar). If the pressure is too high, MEMS sensing structure of a gyroscope will experience higher resistance to movement. Resistance to movement of MEMS sensing structure reduces a speed of movement of the MEMS sensing structure which delays generation and transfer of signals induced by the movement of the MEMS sensing structure. The higher resistance to movement will also decrease precision of the signals generated by the movement of MEMS sensing structure. The decreased precision in turn increases a complexity of calculations used to determine the information being generated by MEMS sensing structure. Also, high pressure in the enclosure of the gyroscope or a resonator takes part in damping the MEMS sensing structure, which adversely affects the intended purpose of the gyroscope or the resonator. As the complexity of a circuit increases, a number of devices in the circuit and a size of the circuit also increase. However, on the other hand, the pressure in an accelerometer shall be greater than that of the gyroscope or the resonator. Although low pressure facilitates the movement of MEMS sensing structure, an accelerometer requires a greater pressure to assist damping of the MEMS sensing structure, in order to prevent the MEMS sensing structure from natural agitation which contributes to high noise.

Nowadays integrating an accelerometer and a gyroscope or a resonator on a same MEMS device generates problems of how to create two hermetic cavities possessing different vacuum pressures. Forming an outgassing layer in one enclosure could increase the vacuum pressure whereas barring the outgassing layer from another enclosure could preserve the low vacuum pressure. Outgassing is a result of dangling bonds formed during formation of the metallization layer and vias in an interconnection structure of the CMOS wafer. During subsequent processing steps, heating causes the dangling bonds to break which releases gas from the interconnect structure. This process is known as outgassing. Pressure is directly proportional to a number of gas molecules in a space. In approaches which do not include an outgassing barrier between the interconnection structure and enclosure, as the number of gas molecules in enclosure rises, the pressure also rises.

Generally an outgassing layer can be made of oxide materials without any outgassing barrier covered thereupon. The outgassing layer can be formed on a CMOS wafer facing the hermetic cavity. A high compactness material which prevents gaseous molecules from out-diffusion, for example, nitride material, can be used as an outgassing barrier. An operation of forming the outgassing barrier layer includes patterning an outgassing barrier to expose a region of the underlying first outgassing layer. The exposed region is then filled with a second outgassing layer and followed by a planarization operation until the second outgassing layer and the outgassing barrier are coplanar. The planarization operation includes, but not limited to, a chemical mechanical polishing (CMP) operation. The planarization operation is designed to reduce the thickness of the overfilled second outgassing layer and hence does not consume the outgassing barrier.

In addition, the second outgassing layer at a center portion of the exposed region is found to have a greater removing rate than that at a peripheral portion of the exposed region where the second outgassing layer and the outgassing barrier are adjoined. A dishing effect can be observed after the planarization operation and this structural defect may cause the subsequently-deposited sensing electrode and conductor not disposing on a flat surface. For example, if the sensing electrode has a mesh pattern, a top surface of the mesh pattern is not coplanar. Even the geometrical shape of the mesh pattern may be altered due to the non-flat surface of the second outgassing layer. The top surface of the mesh pattern would conform to the dishing surface of the underlying second outgassing layer and thus generating an unequal distance between each point of the sensing electrode and the sensing workpiece of the MEMS substrate. Unequal distances between sensing electrode and the sensing structure deteriorate the sensitivity of the sensing signal because such unequal distance would interfere with the capacitance signal derived from the distance between the sensing electrode and the sensing structure.

FIG. 1 is a schematic cross-sectional view of a device wafer in accordance with some embodiments of the present disclosure. The device wafer 10 may also be referred to as a semiconductor device, or a CMOS wafer in the present disclosure. The device wafer includes a substrate (also referred to as a first substrate) 12, an interconnection layer 16, an outgassing layer 18, and a patterned outgassing barrier layer 20. The substrate 12 may include a semiconductor substrate, such as a bulk semiconductor substrate.

The bulk semiconductor substrate includes an elementary semiconductor, such as silicon or germanium; a compound semiconductor, such as silicon germanium, silicon carbide, gallium arsenic, gallium phosphide, indium phosphide, or indium arsenide; or combinations thereof. In some embodiments, the substrate 12 includes a multilayered substrate, such as a silicon-on-insulator (SOI) substrate, which includes a bottom semiconductor layer, a buried oxide layer (BOX) and a top semiconductor layer.

In some embodiments, a plurality of active devices 14 including transistor devices such as CMOS devices is formed in proximity to a surface of the substrate 12. In some embodiments, the active devices 14 are a portion of active circuitry configured to perform calculations or execute procedures based on signals received from a MEMS device (not shown in FIG. 1). In some embodiments, the active devices 14 may further include bi-polar transistor (BJT) devices, Fin field effect transistor (FinFET) devices, or other suitable devices. The substrate 12 can also be referred to as a circuitry substrate. For the sake of illustration, only a portion of the active device 14 is shown in FIG. 1.

The interconnection layer 16 is disposed over the substrate 12 and electrically coupled to the active devices 14. In some embodiments, the interconnection layer 16 includes metallization layer(s) 161 and dielectric layer(s) 162 stacking to one another. The metallization layer 161 may include metallic material such as copper, aluminum, or conductive polymers, alloy such as aluminum copper (AlCu), or other suitable conductive materials. The dielectric layers 162 may include inter-layered dielectrics or inter-metal dielectrics, which may include low-k dielectric layers, ultra low-k layers, non-low-k dielectric layers such as passivation layers, or the like. Low k materials have a dielectric constant less than a dielectric constant of silicon oxide. In some embodiments, low k materials have a dielectric constant less than about 3.9. In some embodiments, low k materials include fluorine-doped silicon oxide, carbon-doped silicon oxide, porous silicon oxide, polymer materials, or other suitable low k materials. In some embodiments, ultra-low k materials have a dielectric constant less than or equal to about 2.5. In some embodiments, ultra-low k materials include xerogel, polymers, or other suitable ultra-low k materials. The interconnection layer 16 may further include vias 163, which may be formed of metal such as copper, aluminum, tungsten, conductive polymers, or other suitable conductive materials, formed in the dielectric layers 162 to electrically couple the metallization layers 161. The interconnection layer 16 is configured to convey signals to and from the active circuitry formed on the substrate 12.

The outgassing layer (also referred to as a first outgassing layer) 18 is disposed over the interconnection layer 16. In some embodiments, the outgassing layer 18 is the upmost dielectric layer of the dielectric layers 162 of the interconnection layer 16. In some embodiments, the upmost surface 18U of the outgassing layer 18 is substantially a planar surface.

The patterned outgassing barrier layer (also referred to as a first patterned outgassing barrier layer) 20 is disposed over the outgassing layer 18. The patterned outgassing barrier layer 20 includes a plurality of barrier structures 201 and a plurality of openings 202 between adjacent barrier structures 201. The barrier structures 201 cover a portion of the upmost surface 18U of the outgassing layer 18, while the openings 202 expose a portion of the upmost surface 18U of the outgassing layer 18. The barrier structures 201 are disposed between a portion of the outgassing layer 18 and a hermetic cavity (shown in FIG. 2). The openings 202 of the patterned outgassing barrier layer 20 expose a portion of the outgassing layer 18 and thus allow gas molecules from the outgassing layer 18 to out gas into the hermetic cavity, so as to adjust the barometric pressure in the hermetic cavity. The numbers and dimensions of the openings 202 may be modified based on the desired amount of outgassing. The patterned outgassing barrier layer 20 and the outgassing layer 18 are formed of different materials. The patterned outgassing barrier layer 20 may include material(s) having high lattice compactness such as silicon nitride to prevent outgassing gas molecules from out-diffusion. In some embodiments, the outgassing layer 18 may be silicon oxide such as Tetraethyl orthosilicate (TEOS), and the patterned outgassing barrier layer 20 may be silicon nitride or silicon oxynitride. In some embodiments, the patterned outgassing barrier layer 20 includes nitrides of Group IV element or oxynitrides of Group IV element.

In some embodiments, the bottommost surface 20B of the patterned outgassing barrier layer 20 is substantially coplanar with the upmost surface 18U of the outgassing layer 18. The opening 202 is a through opening of the patterned outgassing barrier layer 20, and the lateral surfaces 201S of the barrier structures 201 are exposed from the outgassing layer 18. In other words, the opening 202 is an empty hole without being filled by the outgassing layer 18 or other structural layers, such that the exposed outgassing layer 18 can be in contact with the hermetic cavity.

The device wafer 10 may further include conductors (first conductors) 22 and conductive vias 24. The conductors 22 are disposed over the patterned outgassing barrier layer 20. The conductive vias 24 penetrate through the patterned outgassing barrier layer 20 and the outgassing layer 18 to electrically couple the conductors 22 and the metallization layer 161 of the interconnection layer 16. The material of the conductor 22 may include metallic material such as copper, aluminum, gold, germanium, tin, indium or other suitable conductive materials. The conductors 22 may be configured as internal or external terminals. In some embodiments, a portion of the conductors 22 may be bonded to another conductor formed on another wafer e.g., MEMS wafer by any suitable bonding methods such as eutectic bonding, fusion bonding, or solid-liquid inter-diffusion bonding (SLID). In some embodiments, a portion of the conductors 22 may be bonded to external circuit. The material of the conductive vias 24 may include metal such as tungsten, alloy, conductive polymers or other suitable conductive materials.

In some embodiments, the device wafer 10 may further include a conductive film 26 between the conductor 22 and the patterned outgassing barrier layer 20. The material of the conductive film 26 may include titanium nitride or other suitable conductive materials. In some embodiments, the conductive film 26 is configured to enhance adhesion between the conductor 22 and the patterned outgassing barrier layer 20.

In some embodiments, the device wafer 10 further includes a sensing electrode (also referred to as an electrode) 28 over the patterned outgassing barrier layer 20. In case the device wafer 10 is integrated with a MEMS device, the sensing electrode 28 may be configured as a portion of the MEMS device. The sensing electrode 28 may be single-layered or multi-layered. In some embodiments, the sensing electrode 28 may include the same material as the conductive film 26, and may be formed of the same patterned conductive layer as the conductive film 26. In some embodiments, the sensing electrode 28 may include the same materials as the conductive film 26 and the conductor 22, and may be formed of the same patterned conductive layers as the conductive film 26 and the conductor 22.

The present disclosure is not limited to the aforesaid embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 2:
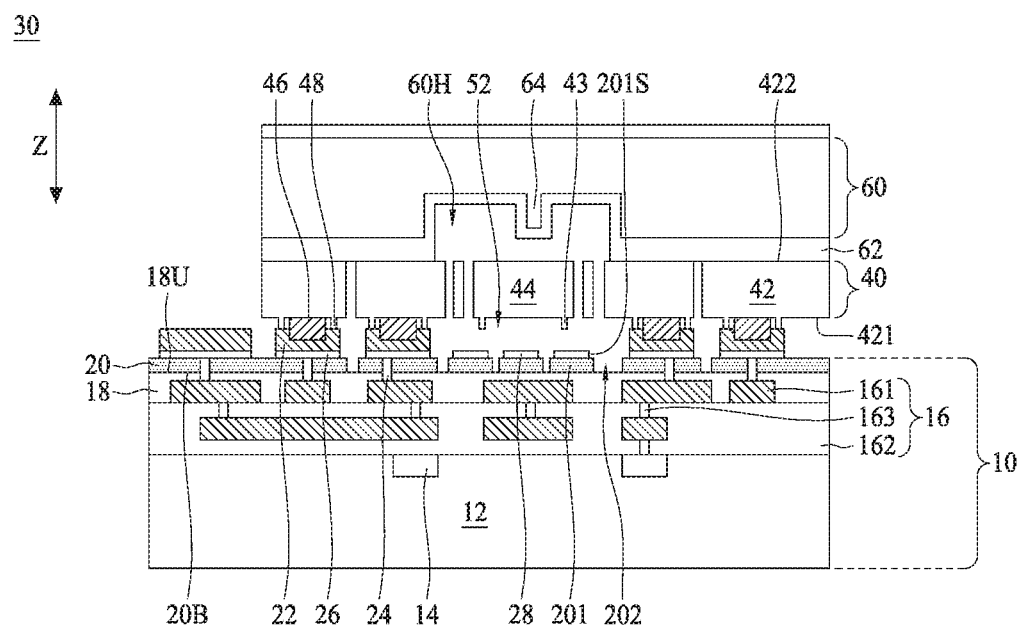
FIG. 2 is a schematic cross-sectional view of a package in accordance with some embodiments of the present disclosure.

FIG. 2 is a schematic cross-sectional view of a package in accordance with some embodiments of the present disclosure. The package 30 includes the device wafer 10 and a MEMS wafer 40 disposed over the device wafer 10. The device wafer 10 is illustrated as in FIG. 1 and related descriptions, and thus details are not redundantly described. The device wafer 10 and the MEMS wafer 40 form a CMOS-MEMS structure. The MEMS wafer 40 includes a second substrate 42, a first sensing structure 44, second conductor 46 and spacers 48. The second substrate 42 may include a semiconductor substrate, and the material of the second substrate 42 may be the same as or different from the substrate 12. The first sensing structure 44 is connected to the second substrate 42 and corresponding to the sensing electrode 28. In some embodiments, the first sensing structure 44 or at least a portion of the first sensing structure 44 may be part of the second substrate 42. The second conductors 46 are disposed over the second substrate 42, and on a surface 421 of the second substrate 42 facing the device wafer 10. The material of the second conductor 46 may include metallic material such as copper, aluminum, gold, germanium, tin, indium or other suitable conductive materials. In some embodiments, the conductor 22 and the second conductor 46 are bonded by eutectic bonding. For example, the conductor 22 is aluminum, and the second conductor 46 is germanium, and the conductor 22 and the second conductor 46 can form aluminum germanium and eutectically bonded to each other. In some embodiments, the dimension of the second conductor 46 is greater than the dimension of the conductor 22 so that the melted second conductor 46 can enclose the conductor 22 to enhance bonding.

The spacer 48 is over the second substrate 42 and in proximity to the second conductor 46. In some embodiments, the spacer 48 is in contact with the conductor 22. The spacer 48 is configured to maintain a gap between the device wafer 10 and the MEMS wafer 40 when the conductor 22 and the second conductor 46 are bonded together. A constant and desired gap between sensing electrode 28 and the sensing structure 44 improves the sensitivity of the sensing signal. In some embodiments, the spacer 48 is a portion of the second substrate 42 and protruded from the surface 421 of the second substrate 42 toward the device wafer 10. In some embodiments, the material of the spacer 48 (e.g., silicon) is relatively stiffer than the material of the second conductor 46 (e.g., metal), particularly when the conductor 22 and the second conductor 46 are compressed and heated during bonding procedure, and therefore the spacer 48 is able to control the gap between the device wafer 10 and the MEMS wafer 40. In some exemplary embodiments, the conductor 22 and the second conductor 46 are eutectically bonded. When the conductor 22 and the second conductor 46 are contacted, compressed and heated to a temperature higher than their eutectic melting point, the contacting region of the conductor 22 and the second conductor 46 will be melted and bonded together. The spacer 48, however, is in contact with a portion of the unmelted conductor 22, and thus is able to maintain the gap between the device wafer 10 and the MEMS wafer 40. In some embodiments, the height of the spacer 48 is less than the height of the second conductor 46 such that both of bonding effect and gap maintaining effect can be considered. In some embodiments, the spacer 48 may be disposed at one side or two sides of the second conductor 46. In some other embodiments, the spacer 48 may surround the second conductor 46. In some embodiments, the spacer 48 is also configured to prevent the melted second conductor 46 from overflowing.

The package 30 may further include a cap substrate (also referred to as a cap wafer or a handle wafer) 60 attached to the MEMS wafer 40. The cap substrate 60 is attached to the other surface 422 of the second substrate 42. The material of the cap substrate 60 may be the same as or different from the substrate 12 or the second substrate 42. The cap substrate 60 and the second substrate 42 may be bonded by any suitable bonding methods. By way of an example, the cap substrate 60 and the second substrate 42 are interposed with an intermediate layer 62 such as a silicon oxide layer and bonded by fusion bonding. In some embodiments, the cap substrate 60 has a recess 60H corresponding to the first sensing structure 44.

The device wafer 10, the MEMS wafer 40, the cap wafer 60 are hermetically bonded, thereby defining a first hermetic cavity 52 in which the first sensing structure 44 is sealed. The barometric pressure in the first hermetic cavity 52 can be adjusted by outgassing gas from the outgassing layer 18 through the openings 202 of the patterned outgassing barrier layer 20. In some embodiments, the first sensing structure 44 is a movable structure such as a proof mass, a spring and/or a diaphragm, which may be moved or resonated under a force, pressure or a vibration. In some embodiments, the first sensing structure 44 is configured to move or resonate along a direction Z substantially perpendicular to the surface 421 of the second substrate 42. In some embodiments, the first sensing structure 44 and the sensing electrode 28 form a MEMS device. In some exemplary embodiments, the first sensing structure 44 and the sensing electrode 28 form an accelerometer, which requires a relative high barometric pressure so that the first sensing structure 44 is less sensitive to unexpected vibration.

In some embodiments, the MEMS wafer 40 further comprises a first stopper 43 connected to the first sensing structure 44 and facing the sensing electrode 28. The first stopper 43 is configured to prevent the first sensing structure 44 from being adhered to the sensing electrode 28 if the first sensing structure 44 moves toward and in contact with the sensing electrode 28 due to excessive movement. In some embodiments, the first stopper 43 is a portion of the first sensing structure 44 protruded toward the sensing electrode 28. In some embodiments, the first stopper 43 and the spacer 48 are formed simultaneously by patterning the second substrate 42. The height of the first stopper 43 may be the same as that of the spacer 48, but not limited thereto. The height, dimension, number and position of the first stopper 43 can be modified to provide proper anti-stiction effect.

In some embodiments, a second stopper 64 is disposed over the cap substrate 60 and in the recess 60H. The second stopper 64 is configured to prevent the first sensing structure 44 from being adhered to the cap substrate 60 if the first sensing structure 44 moves toward and in contact with the cap substrate 60 due to excessive movement. In some embodiments, the second stopper 64 may be a portion of the cap substrate 60 protruded toward the first sensing structure 44. The height, dimension, number and position of the second stopper 64 can be modified to provide proper anti-stiction effect.

Figure 3:
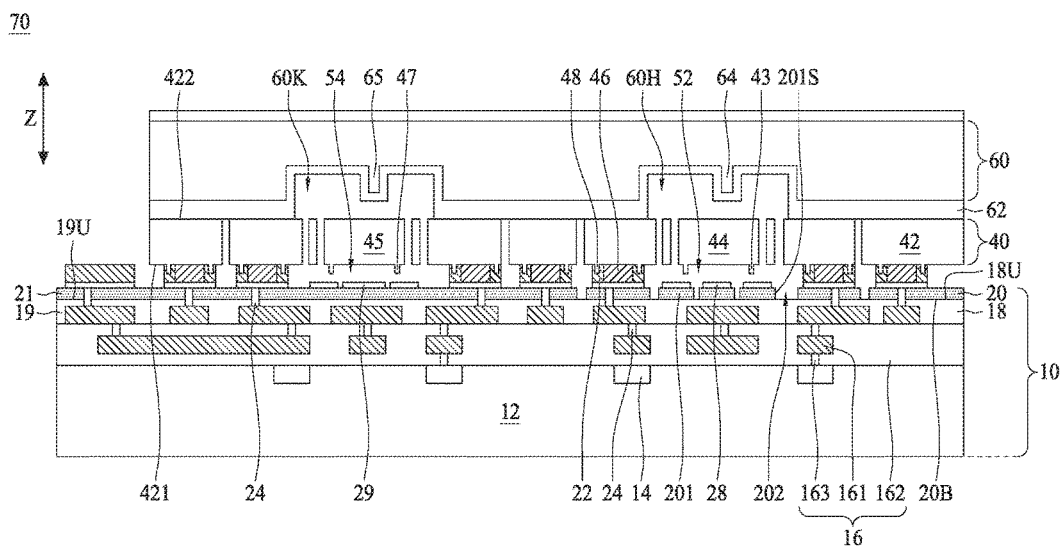
FIG. 3 is a schematic cross-sectional view of a package in accordance with some embodiments of the present disclosure.

FIG. 3 is a schematic cross-sectional view of a package in accordance with some embodiments of the present disclosure. The package 70 integrates the CMOS-MEMS structure of FIG. 2 with another CMOS-MEMS structure. The device wafer 10 further includes a second outgassing layer 19, a second outgassing barrier layer 21 and a second sensing electrode 29. In some embodiments, the second outgassing layer 19 and the outgassing layer 18 are formed of the same material layer such as a silicon oxide layer. The second outgassing barrier layer 21 is disposed over the second outgassing layer 19. In some embodiments, the second outgassing barrier layer 21 and the patterned outgassing barrier layer 20 are formed of the same material layer such as a silicon nitride layer. In some embodiments, the second outgassing barrier layer 21 covers an upmost surface 19U of the second outgassing layer 19 to prevent outgassing from the second outgassing layer 19 into a second hermetic cavity 54. The second hermetic cavity 54 is defined by the device wafer 10, the MEMS wafer 40 and the cap wafer 60, and is isolated from the first hermetic cavity 52. The second sensing electrode 29 is disposed over the second outgassing barrier layer 21. In some embodiments, the second sensing electrode 29 and the sensing electrode 28 are formed of the same conductive layer. The second sensing electrode 29 may be configured as a portion of a MEMS device.

The MEMS wafer 40 further includes a second sensing structure 45 connected to the second substrate 42 and corresponding to the second sensing electrode 29. In some exemplary embodiments, the first sensing structure 44 and the sensing electrode 28 form a first MEMS device such as an accelerometer in the first hermetic cavity 52, and the second sensing structure 45 and the second sensing electrode 29 form a second MEMS device such as a gyroscope or a resonator in the second hermetic cavity 54. As accelerometer requires a relative high barometric pressure, the openings 202 of the patterned outgassing barrier layer 20 allow gas molecules from the outgassing layer 18 to outgas into the first hermetic cavity 52 to increase the pressure. On the other hand, as gyroscope or resonator requires a relative low barometric pressure, the second outgassing barrier layer 21 helps to prevent outgassing from the second outgassing layer 19 into the second hermetic cavity 54 to maintain the pressure.

In some embodiments, the MEMS wafer 40 further includes another first stopper 47 connected to the second sensing structure 45 and facing the second sensing electrode 29. In some embodiments, the cap substrate 60 further includes another recess 60K corresponding to the second sensing structure 45. In some embodiments, the cap substrate 60 further includes another second stopper 65 in the recess 60K.

Figure 4:
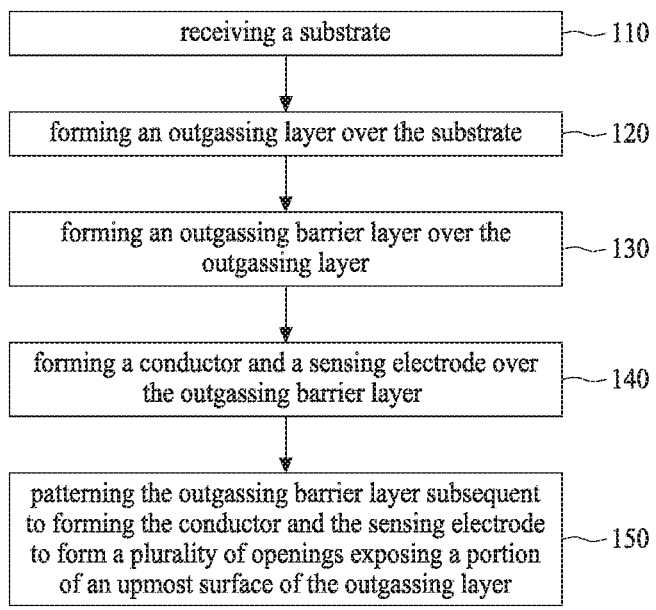
FIG. 4 is a flow chart illustrating a method for manufacturing a semiconductor device according to various aspects of the present disclosure.

FIG. 4 is a flow chart illustrating a method for manufacturing a semiconductor device according to various aspects of the present disclosure. The method 100 begins with operation 110 in which a substrate is received. The method 100 continues with operation 120 in which an outgassing layer is formed over the substrate. The method 100 proceeds with operation 130 in which an outgassing barrier layer is formed over the outgassing layer. The method 100 continues with operation 140 in which a conductor and a sensing electrode are formed over the outgassing barrier layer. The method 100 continues with operation 150 in which the outgassing barrier layer is patterned subsequent to forming the conductor and the sensing electrode to form a plurality of openings exposing a portion of an upmost surface of the outgassing layer.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 5A:
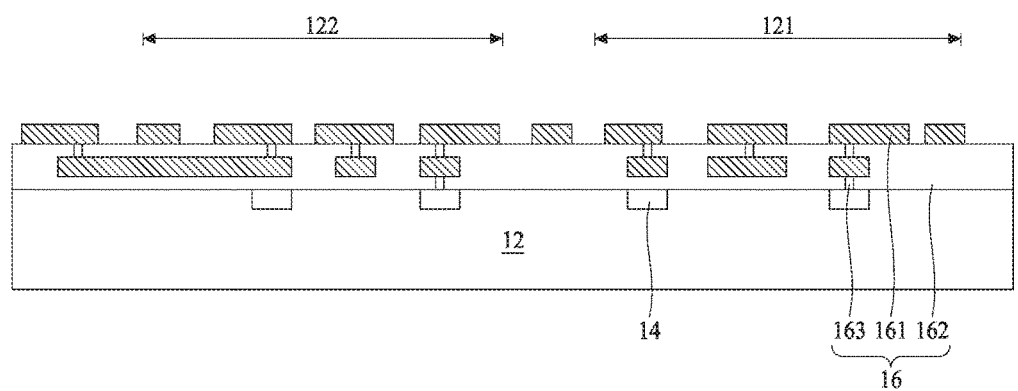
FIGS. 5A-5I are cross-sectional views at one of various operations of manufacturing a semiconductor device according to some embodiments of the present disclosure.

FIGS. 5A-5I are cross-sectional views at one of various operations of manufacturing a semiconductor device according to some embodiments of the present disclosure. As depicted in FIG. 5A and operation 110 in FIG. 4, a substrate 12 is received. In some embodiments, the substrate 12 includes a first region 121 and a second region 122 configured to form different MEMS devices respectively. A plurality of active devices 14 such as CMOS devices is formed in proximity to a surface of the substrate 12. An interconnection layer 16 is formed over the substrate 12 and electrically coupled to the active devices 14. In some embodiments, the interconnection layer 16 includes metallization layer(s) 161, dielectric layer(s) 162 and vias 163.

Figure 5B:
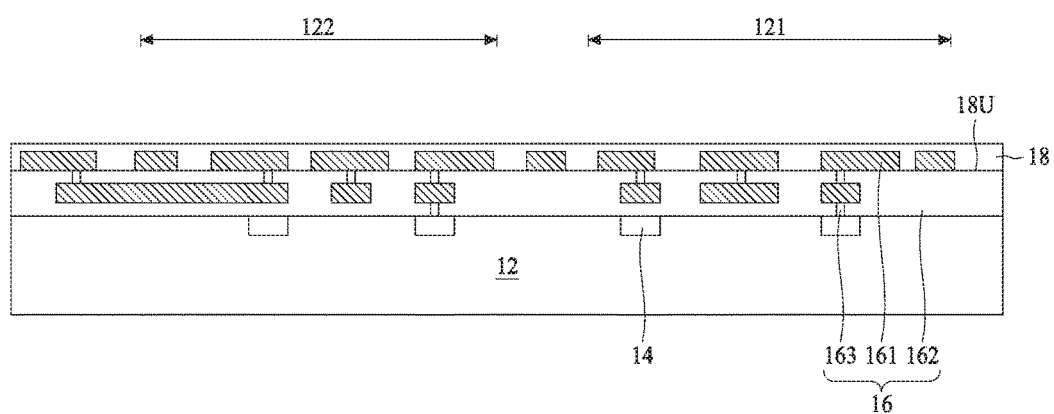

As depicted in FIG. 5B and operation 120 in FIG. 4, an outgassing layer 18 is formed over the substrate 12. The outgassing layer 18 is planarized, for example by chemical mechanical polishing (CMP), thereby rendering the outgassing layer 18 a planar upmost surface 18T.

Figure 5C:
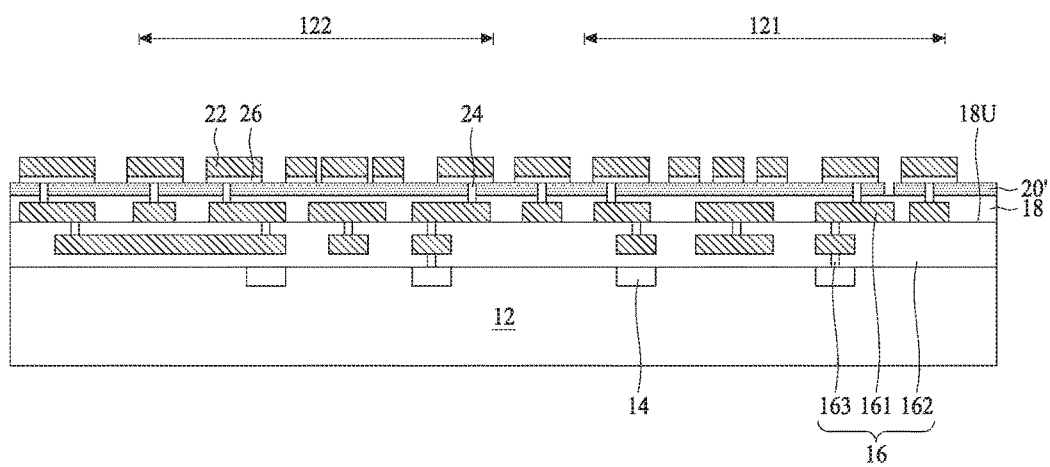

As depicted in FIG. 5C and operation 130 in FIG. 4, an outgassing barrier layer 20' is formed over the outgassing layer 18. Subsequently, a plurality of conductive vias 24 penetrating through the outgassing barrier layer 20' and the outgassing layer 18 to electrically connect the exposed metallization layer 161. In some embodiments, the outgassing barrier layer 20' and the outgassing layer 18 are recessed to expose the upmost metallization layer 161. A conductive layer is then formed over the outgassing barrier layer 20' and in the recesses. The conductive layer outside the recesses is then removed by CMP for example. It is appreciated that though the outgassing barrier layer 20' is recessed, but the conductive vias 24 are filled in the recesses to cover the portion of the exposed outgassing layer 18. Therefore, undesired outgassing from the outgassing layer 18 is avoided. The conductive layer is formed over the outgassing barrier layer 20' with a planar surface, and thus the conductive layer on the planar surface of the outgassing barrier layer 20' can be removed without leaving residues. This mitigates risk of short circuitry.

Figure 5D:
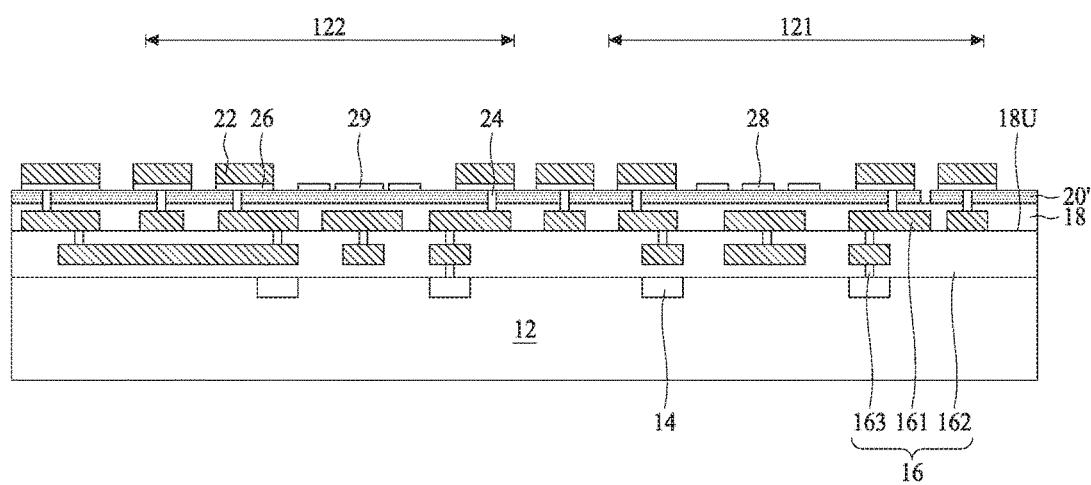

In some embodiments, conductive films 26 are formed over the outgassing barrier layer 20' and electrically coupled to the conductive vias 24. In some embodiments, conductors 22 are formed over the conductive films 26. In some embodiments, the conductive films 26 and the conductors 22 are formed through the same patterning operation e.g. the same photolithography operation. The conductive films 26 and the conductors 22 are formed over the outgassing barrier layer 20' with a planar surface, and thus the conductive films 26 and the conductors 22 on the planar surface of the outgassing barrier layer 20' can be formed without leaving residues. This mitigates risk of short circuitry As depicted in FIG. 5D and operation 140 in FIG. 4, a portion of the conductors 22 in the first region 121 and the second region 122 are removed. In some embodiments, a portion of the exposed conductive films 26 in the first region 121 is configured as a sensing electrode (first sensing electrode) 28, and another portion of the exposed conductive films 26 in the second region 122 is configured as a second sensing electrode 29.

Figure 5E:
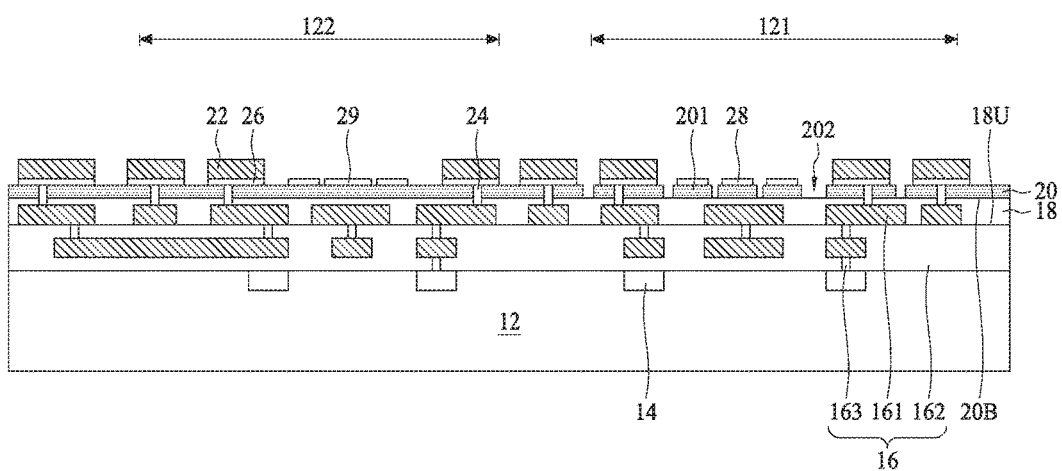

As depicted in FIG. 5E and operation 150 in FIG. 4, subsequent to forming the conductor 22, the sensing electrode 28 and the second sensing electrode 29, the outgassing barrier layer 20' is patterned to form a patterned outgassing barrier layer 20. The patterned outgassing barrier layer 20 includes a plurality of barrier structures 201 and a plurality of openings 202 in the first region 121, while the patterned outgassing barrier layer 20 covers the outgassing layer 18 in the second region 122. It is appreciated that the plurality of openings 202 in the first region 121 is formed after forming the conductive vias 24, the conductive films 26 and the conductors 22, and thus no residues of the conductive vias 24, the conductive films 26 and the conductors 22 are in the openings 202.

Figure 5F:
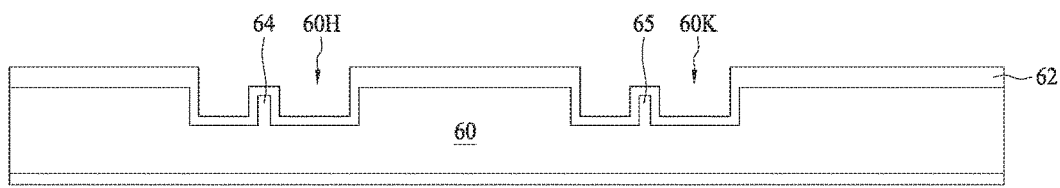

As depicted in FIG. 5F, a cap substrate 60 is received. The cap substrate 60 is patterned to form recesses 60H and 60K, and second stoppers 64 and 65 in the recesses 60H and 60K respectively. In some embodiments, an intermediate layer 62 is formed on the surface of the cap substrate 60.

Figure 5G:
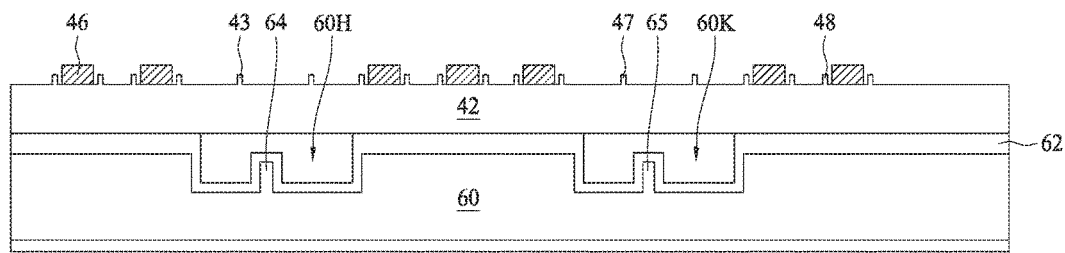

As depicted in FIG. 5G, a second substrate 42 is received. The second substrate 42 is attached to the cap substrate 60, which is configured as a support substrate or a handle substrate for the second substrate 42. In some embodiments, the second substrate 42 and the cap substrate 60 are attached by fusion bonding using the intermediate layer 62 as an adhesive layer. In some embodiments, the second substrate 42 is thinned down when supported by the cap substrate 60. Spacers 48 and first stoppers 43 and 47 are formed. In some embodiments, the pacers 48 and first stoppers 43 and 47 are portions of the second substrate 42 and formed by patterning the second substrate 42. In some embodiments, second conductors 46 are formed over the second substrate 42 and in proximity to the spacer 48.

Figure 5H:
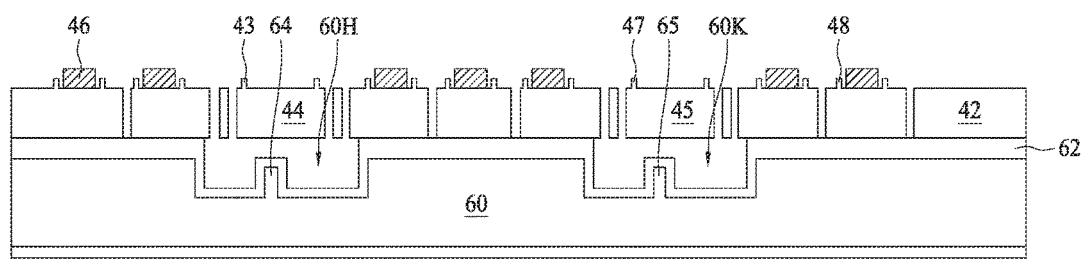

As depicted in FIG. 5H, the second substrate 42 is patterned to form a first sensing structure 44 and a second sensing structure 45. The second substrate 42 may be patterned by any suitable patterning methods such as etching.

Figure 5I:
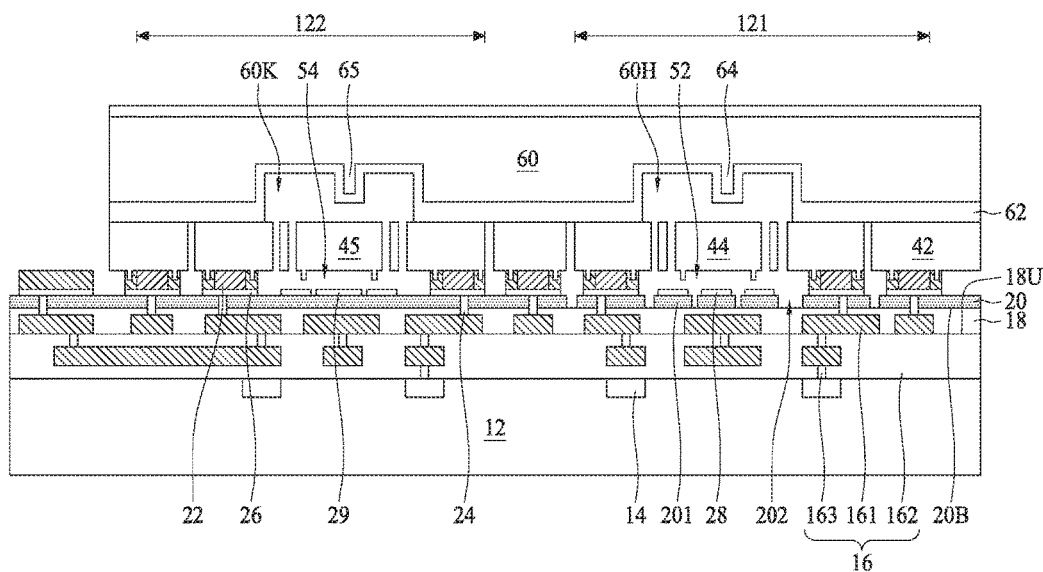

As depicted in FIG. 5I, the second substrate 42 and the substrate 12 are assembled by bonding the conductors 22 and the second conductors 46. In some embodiments, the conductors 22 and the second conductors 46 are bonded by eutectic bonding. The spacers 48 are configured to maintain the gap between the second substrate 42 and the substrate 12. In some embodiments, the cap substrate 60 and the second substrate 42 are diced to expose a portion of the conductor 22 configured as a terminal for external connection. The substrate 12 is diced to form a package 70. The bonded first substrate 12, second substrate 42 and cap substrate 60 form a first hermetic cavity 52 in the first region 121 and a second hermetic cavity 54 in the second region 122 isolated from each other. In the first hermetic cavity 52, the sensing electrode 28 and the first sensing structure 44 form a first MEMS device. The portion of the patterned outgassing barrier layer 20 with openings 202 allows the outgassing layer 18 to be exposed in the first hermetic cavity 52, and thus gas molecules are able to outgas from the outgassing layer 18 into the first hermetic cavity 52. Therefore, the pressure in the first hermetic cavity 52 is increased when the first MEMS device is operated. In the second hermetic cavity 54, the second sensing electrode 29 and the second sensing structure 45 form a second MEMS device. The portion of the patterned outgassing barrier layer 20 without openings blocks the outgassing layer 18 from outgassing into the second hermetic cavity 54, and thus the pressure in the second hermetic cavity 54 is lower than that in the first hermetic cavity 52. The different pressures in the first hermetic cavity 52 and the second hermetic cavity 54 are respectively configured based on the requirements for different MEMS devices. In some embodiment, the first MEMS device such as an accelerometer requires to be operated in high pressure condition, and the second MEMS device such as a gyroscope or a resonator requires to be operated in low pressure condition.

In the present disclosure, the CMOS-MEMS package includes hermetic cavities with different pressures for different MEMS devices by outgassing from an outgassing layer. The amount of outgassing is controlled by patterned outgassing barrier layer. The patterned outgassing barrier layer is patterned subsequent to forming conductors and electrodes, and thus reduces process complexity and risk of short circuitry. The CMOS-MEMS package includes spacers which are able to maintain the gap between CMOS wafer and MEMS wafer, thereby enhancing capacitance control of the MEMS device. The CMOS-MEMS package includes stopper structures, which are able to alleviate stiction problem.

In one exemplary aspect, a semiconductor device is provided. The semiconductor device includes a substrate, an interconnection layer, an outgassing layer, and a patterned outgassing barrier layer. The interconnection layer is over the substrate. The outgassing layer is over the interconnection layer. The patterned outgassing barrier layer is over the outgassing layer. The patterned outgassing barrier layer includes a plurality of barrier structures and a plurality of openings. The plurality of openings expose a portion of an upmost surface of the outgassing layer, and a bottommost surface of the patterned outgassing barrier layer is substantially coplanar with the upmost surface of the outgassing layer.

In another exemplary aspect, a package is provided. The package includes a device wafer and a MEMS wafer over the device wafer. The device wafer includes a first substrate, a first outgassing layer, a first patterned outgassing barrier layer, a first sensing electrode and a first conductor. The first outgassing layer is over the first substrate. The first patterned outgassing barrier layer is over the first outgassing layer. The first patterned outgassing barrier layer includes a plurality of openings exposing a portion of an upmost surface of the first outgassing layer, and a bottommost surface of the first patterned outgassing barrier layer is substantially coplanar with the upmost surface of the first outgassing layer. The first sensing electrode is over a portion of the first patterned outgassing barrier layer. The first conductor is over another portion of the first patterned outgassing barrier layer. The MEMS wafer includes a second substrate, a first sensing structure, a second conductor and a spacer. The first sensing structure is connected to the second substrate and corresponding to the first sensing electrode. The second conductor is over the second substrate and bonded to the first conductor. The spacer is over the second substrate and in proximity to the second conductor. The spacer is in contact with the first conductor.

In yet another aspect, a method for manufacturing a semiconductor device is provided. A substrate is received. An outgassing layer is formed over the substrate. An outgassing barrier layer is formed over the outgassing layer. A conductor and a sensing electrode are formed over the outgassing barrier layer. The outgassing barrier layer is patterned subsequent to forming the conductor and the sensing electrode to form a plurality of openings exposing a portion of an upmost surface of the outgassing layer.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   an interconnection layer over the substrate;
   an outgassing layer over the interconnection layer;
   a patterned outgassing barrier layer over the outgassing layer, wherein the patterned outgassing barrier layer includes a plurality of barrier structures and a plurality of openings, the plurality of openings expose a portion of an upmost surface of the outgassing layer, and a bottommost surface of the patterned outgassing barrier layer is substantially coplanar with the upmost surface of the outgassing layer; and
   an electrode over the patterned outgassing barrier layer.

2. The semiconductor device of claim 1, further comprising an active device between the substrate and the interconnection layer, wherein the active device is electrically coupled to the interconnection layer.

3. The semiconductor device of claim 1, further comprising:
   a conductor over the patterned outgassing barrier layer; and
   a conductive via penetrating through the patterned outgassing barrier layer and the outgassing layer to electrically couple the interconnection layer and the conductor.

4. The semiconductor device of claim 1, wherein the outgassing layer comprises silicon oxide.

5. The semiconductor device of claim 1, wherein the patterned outgassing barrier layer comprises silicon nitride.

6. The semiconductor device of claim 1, wherein lateral surfaces of the barrier structures are exposed from the outgassing layer.

7. The semiconductor device of claim 1, wherein the interconnection layer comprises a metallization layer and a dielectric layer stacking to one another.

8. A package, comprising:
   a device wafer comprising:
      a first substrate;
      a first outgassing layer over the first substrate;
      a first patterned outgassing barrier layer over the first outgassing layer, wherein the first patterned outgassing barrier layer includes a plurality of openings exposing a portion of an upmost surface of the first outgassing layer, and a bottommost surface of the first patterned outgassing barrier layer is substantially coplanar with the upmost surface of the first outgassing layer;
      a first sensing electrode over a portion of the first patterned outgassing barrier layer; and
      a first conductor over another portion of the first patterned outgassing barrier layer; and
   a MEMS wafer over the device wafer, the MEMS wafer comprising:
      a second substrate;

a first sensing structure connected to the second substrate and corresponding to the first sensing electrode;
a second conductor over the second substrate and bonded to the first conductor; and
a spacer over the second substrate and in proximity to the second conductor, wherein the spacer is in contact with the first conductor.

9. The package of claim 8, wherein a height of the spacer is less than a height of the second conductor.

10. The package of claim 8, wherein the first sensing structure and the first sensing electrode form an accelerometer.

11. The package of claim 8, wherein the device wafer further comprises:
a second outgassing layer;
a second outgassing barrier layer over the second outgassing layer; and
a second sensing electrode over the second outgassing barrier layer.

12. The package of claim 11, wherein an upmost surface of the second outgassing layer is covered by the second outgassing barrier layer.

13. The package of claim 11, wherein the MEMS wafer further comprises a second sensing structure connected to the second substrate and corresponding to the second sensing electrode.

14. The package of claim 13, wherein the second sensing structure and the second sensing electrode form a gyroscope or a resonator.

15. The package of claim 11, wherein the first sensing structure is sealed in a first hermetic cavity, the second sensing structure is sealed in a second hermetic cavity isolated from the first hermetic cavity, and a barometric pressure in the first hermetic cavity is higher than a barometric pressure in the second hermetic cavity.

16. The package of claim 8, wherein the MEMS wafer further comprises a first stopper connected to the first sensing structure and facing the first sensing electrode.

17. The package of claim 8, further comprising:
a cap substrate attached to the MEMS wafer, wherein the cap substrate has a recess corresponding to the first sensing structure; and
a second stopper over the cap substrate and in the recess.

18. A method for manufacturing a semiconductor device, comprising:
receiving a substrate;
forming an outgassing layer over the substrate;
forming an outgassing barrier layer over the outgassing layer;
forming a first conductor and a sensing electrode over the outgassing barrier layer; and
patterning the outgassing barrier layer subsequent to forming the first conductor and the sensing electrode to form a plurality of openings exposing a portion of an upmost surface of the outgassing layer.

19. The method of claim 18, further comprising:
receiving a cap substrate; and
patterning the cap substrate to form a recess and a second stopper in the recess.

20. The method of claim 19, further comprising:
receiving a second substrate;
attaching the second substrate to the cap substrate;
forming a spacer and a first stopper on the second substrate;
forming a second conductor over the second substrate;
patterning the second substrate to form a sensing structure; and
bonding the second conductor to the first conductor.

* * * * *